United States Patent
Sharma

(10) Patent No.: US 7,193,889 B2
(45) Date of Patent: *Mar. 20, 2007

(54) SWITCHING OF MRAM DEVICES HAVING SOFT MAGNETIC REFERENCE LAYERS

(75) Inventor: Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 128 days.

This patent is subject to a terminal disclaimer.

(21) Appl. No.: 10/776,061

(22) Filed: Feb. 11, 2004

(65) Prior Publication Data

US 2005/0174828 A1    Aug. 11, 2005

(51) Int. Cl.
*G11C 11/00*    (2006.01)

(52) U.S. Cl. .................. 365/158; 365/171; 365/173; 257/421

(58) Field of Classification Search ............... 365/158, 365/141, 171, 173; 257/421
See application file for complete search history.

(56) References Cited

U.S. PATENT DOCUMENTS

| | | |
|---|---|---|
| 3,582,912 A | 6/1971 | Valin et al. |
| 5,224,068 A | 6/1993 | Miyake et al. |
| 5,396,455 A | 3/1995 | Brady et al. |
| 5,444,651 A | 8/1995 | Yananoto et al. |
| 5,640,343 A | 6/1997 | Gallagher et al. |
| 5,761,110 A | 6/1998 | Irrinki et al. |
| 5,933,365 A | 8/1999 | Klersy et al. |
| 5,936,882 A | 8/1999 | Dunn |
| 5,953,245 A | 9/1999 | Nishimura |
| 5,956,295 A | 9/1999 | Yamakawa et al. |
| 6,016,290 A | 1/2000 | Chen et al. |
| 6,028,786 A | 2/2000 | Nishimura |
| 6,051,851 A | 4/2000 | Ohmi et al. |
| 6,130,835 A | 10/2000 | Scheuerlein |
| 6,163,477 A | 12/2000 | Tran |
| 6,188,615 B1 | 2/2001 | Perner et al. |
| 6,233,206 B1 | 5/2001 | Hamann et al. |
| 6,339,544 B1 | 1/2002 | Chiang et al. |
| 6,385,082 B1 * | 5/2002 | Abraham et al. ........... 365/171 |
| 6,404,674 B1 | 6/2002 | Anthony et al. |
| 6,504,221 B1 * | 1/2003 | Tran et al. .................. 257/421 |

(Continued)

FOREIGN PATENT DOCUMENTS

JP    04023293    1/1992

(Continued)

*Primary Examiner*—Richard Elms
*Assistant Examiner*—Alexander Sofocleous

(57) ABSTRACT

A magnetic random access memory (MRAM) that includes an array of magnetic memory cells and a plurality of word and bit lines connecting columns and rows of the memory cells so that the memory cells are positioned at cross-points of the word and bit lines. Each memory cell has a magnetic reference layer and a magnetic data layer. Each magnetic reference layer and each magnetic data layer has a magnetization that is switchable between two states under the influence of a magnetic field and each reference layer has at a first temperature a coercivity that is lower than that of each data layer at the first temperature. The MRAM also includes a plurality of heating elements each proximate to a respective data layer. Each heating element provides in use for localized heating of the respective data layer to reduce the coercivity of the data layer so as to facilitate switching of the data layer.

12 Claims, 4 Drawing Sheets

U.S. PATENT DOCUMENTS

| | | |
|---|---|---|
| 6,552,926 B2 | 4/2003 | Komori |
| 6,702,186 B1 | 3/2004 | Hamann et al. |
| 6,764,897 B2 | 7/2004 | Lowrey et al. |
| 6,819,586 B1 | 11/2004 | Anthony et al. |
| 6,865,105 B1 * | 3/2005 | Tran .................. 365/158 |
| 6,920,065 B2 * | 7/2005 | Ohmori ............... 365/173 |
| 6,925,003 B2 | 8/2005 | Tran et al. |
| 6,930,369 B2 | 8/2005 | Nickel et al. |
| 2001/0019461 A1 | 9/2001 | Allenspach et al. |
| 2002/0089874 A1 | 7/2002 | Nikel et al. |
| 2003/0058684 A1 * | 3/2003 | Tran et al. .......... 365/158 |
| 2003/0123282 A1 | 7/2003 | Nikel et al. |
| 2003/0198113 A1 | 10/2003 | Abraham et al. |
| 2003/0202375 A1 * | 10/2003 | Sharma et al. ......... 365/158 |
| 2003/0206434 A1 * | 11/2003 | Leuschner ............. 365/173 |
| 2004/0057263 A1 * | 3/2004 | Tang .................... 365/33 |
| 2005/0052902 A1 * | 3/2005 | Smith et al. .......... 365/158 |
| 2005/0169034 A1 * | 8/2005 | Perner ................. 365/100 |
| 2005/0173771 A1 * | 8/2005 | Sharma ................ 257/421 |

FOREIGN PATENT DOCUMENTS

| | | |
|---|---|---|
| WO | WO00/79540 | 12/2000 |

* cited by examiner

SWITCHING OF MRAM DEVICES HAVING SOFT MAGNETIC REFERENCE LAYERS

FIELD OF THE INVENTION

The present invention relates to magnetic memory devices, and more specifically to techniques for switching of the memory devices.

BACKGROUND OF THE INVENTION

Non-volatile memory devices such as magneticrandom access memory (MRAM) devices are of interest for replacement of volatile memory devices such as dynamic random access memory (DRAM) devices. Such MRAM devices include an array of individual MRAM cells which may be tunnelling magnetoresistance memory (TMR) cells, colossal magnetoresistance memory cells (CMR) or giant magnetoresistance memory (GMR) cells.

In general, the MRAM cells include a data layer and a reference layer. The data layer is composed of a magnetic material and during a write operation the magnetization of the data layer can be switched between two opposing states by an applied magnetic field and thus binary information can be stored. The reference layer usually is composed of a magnetic material in which the magnetization is pinned so that the magnetic field that is applied to the data layer and in part penetrates the reference layer, is of insufficient strength to switch the magnetization in the reference layer.

For example in a TMR cell the data layer and the reference layer are separated by a thin dielectric layer which is arranged so that a tunnelling junction is formed. Any material comprises two types of electrons which have spin-up and spin down polarity. In the case of a ferromagnetic layer that has a magnetization, more electron spins have one orientation compared with the other one which gives rise to the magnetization. The electrical resistance through the layers is dependent on the relative orientations of the magnetizations in the data and reference layers. This is the tunneling magneto-resistance (TMR) effect and the state of the data layer can be read by measuring the apparent electric resistance across the layers.

The data layer typically includes a low coercivity material that can be switched in its magnetic direction by column and row data-write currents.

The reference layer usually is fabricated with a high coercivity material and is permanently magnetized in a set direction during an annealing processing step.

In one version of the memory cell, namely the so-called the "spin-valve", the reference layer is "pinned" by exchange coupling by an adjacent antiferromagnetic layer.

Alternatively, the reference layer may be soft-magnetic reference layer and may have a lower coercivity so that the reference layer may be switched together with the data layer. In this case the magnetic field of a control current is used to switch the magnetization of the reference layer to the reference state after the data layer is switched. The coercivity of the reference layer and the magnitude of the control current need to be chosen so that switching the reference layer does not affect the data layer.

In general, the magnetic memory cells should be as small as possible. However, the smaller the cells are made, the more sensitive they are to thermal stability problems during operation. In order to compensate, the small magnetic memory cell data layer are fabricated with magnetic material that is more resistant to magnetic change. Unfortunately, generating the stronger fields necessary makes switching the memory cells more difficult during the write operation. Hence, there is a need for a magnetic memory device in which writing is facilitated.

SUMMARY OF THE INVENTION

Briefly, a magnetic random access memory (MRAM) embodiment of the present invention includes an array of magnetic memory cells. A plurality of word and bit lines connects columns and rows of the memory cells so that the memory cells are positioned at cross-points of the word and bit lines. Each memory cell has a magnetic reference layer and a magnetic data layer. Each magnetic reference layer and each magnetic data layer has a magnetization that is switchable between two states under the influence of a magnetic field and each reference layer has at a first temperature a coercivity that is lower than that of each data layer at the first temperature. The MRAM also includes a plurality of heating elements each proximate to a respective data layer. Each heating element provides in use for localized heating of the respective data layer to reduce the coercivity of the data layer so as to facilitate switching of the data layer.

The present invention will be more fully understood from the following description of specific embodiments. The description is provided with reference to the accompanying drawings.

DETAILED DESCRIPTION

Figure 1:
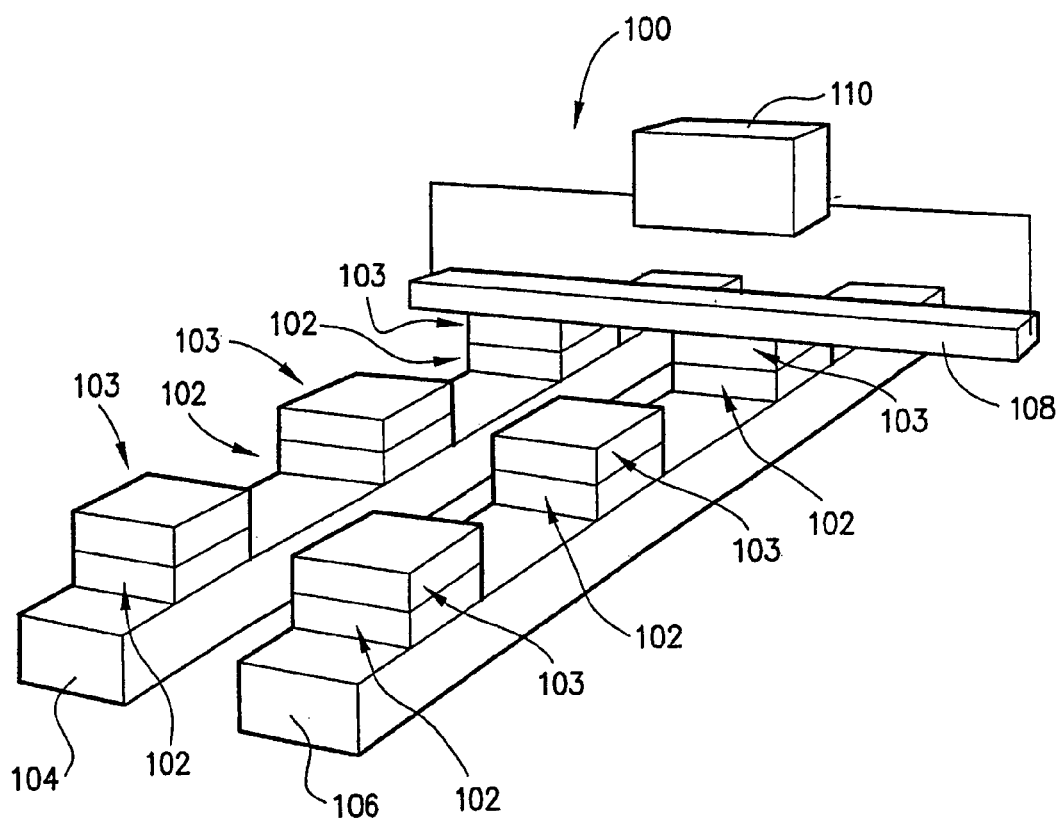
FIG. 1 is a perspective diagram of a magnetic memory device according to a specific embodiment.

FIG. 1 represents a magnetic random access memory (MRAM) array according to a specific embodiment, and is referred to herein by the general reference numeral 100. The MRAM 100 includes an array of magnetic memory cells 102 and electrical heaters 103 in a cross-point arrangement. In this embodiment, each memory cell 102 is based on tunneling magneto-resistance (TMR) technology in which tunneling currents tunnel through a dielectric layer affected by local magnetic fields. Individual cells 102 are selectively addressed for read-write access by word lines 104 and 106, and bit lines 108. These word and bit lines represent hundreds of such lines that constitute and implement the cross-point array.

When a data-write current is applied to bit line 108, a magnetic field will surround the bit line. The magnetic field is used to switch the magnetic memory cells 102 by switching the permanent-magnet data layer to the opposite polarization. Binary information can therefore be stored as a function of the direction of the magnetic field generated by the current applied to bit line 108. During switching the heaters 103 generate heat which lowers the magnetic field strength that is required to switch the memory cells 102 and thus heating facilitate switching of the memory cells.

FIG. 1 includes a data-write generator 110 that outputs a data-write current through bit line 108. The circuit may also generate a current through word lines 104 and 106. (Electrical connections to the data-write generator 110 are not shown for word lines 104 and 106).

Although not illustrated in FIG. 1, MRAM 100 typically includes a read circuit for sensing the resistance of selected memory cells 102. During read operation, a constant voltage is applied to the bit line 110 and sensed by the read circuit. An external circuit may provide the constant supply voltage.

MRAM 100 may comprise an array having any number of memory cells 102 arranged in any number of rows and columns. It can also use alternative technologies such as colossal magneto-resistance memory cells (CMR), and giant magneto-resistance memory (GMR) cells.

Figure 2:
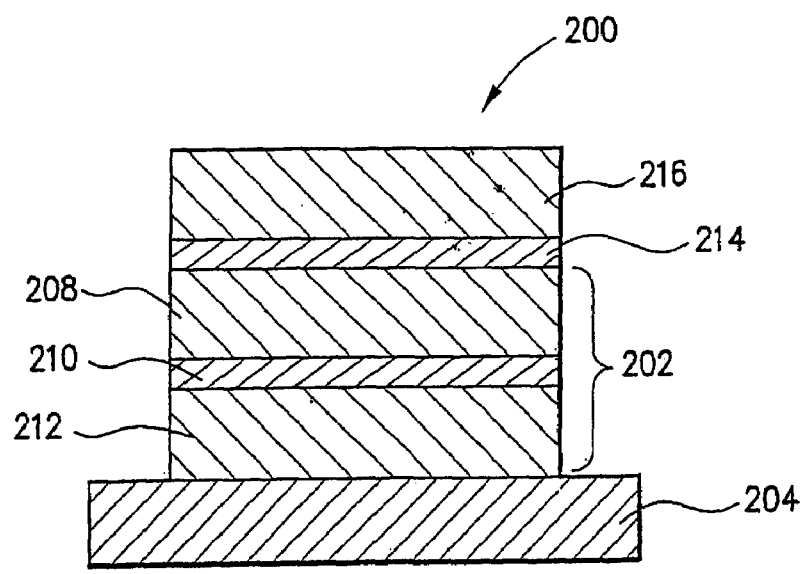
FIG. 2 is a schematic cross-sectional diagram of a magnetic memory device according to another specific embodiment.

FIG. 2 shows a cross-sectional diagram of the memory cell 202 contacted by the word line 204. The memory cell 202 comprises a data layer 208, a thin dielectric layer 210 and a reference layer 212. In general, MRAM 200 is such that the magnetization in the data layer 208 can have two opposing directions so that binary information can be stored as a function of the direction of the magnetic field generated by the current applied to bit line 216.

The data layer 208 uses a magnetic material with a direction of magnetization that can be switched as a function of an applied magnetic field. The reference layer 212 is a soft magnetic layer and has a coercivity that is lower than that of the data layer 208. When the magnetization of the data layer 208 is switched, the magnetization of the soft-magnetic reference layer 212 typically will also switch. After a switching operation a current will be directed through word line 204 so that a magnetic field is generated in the reference layer 212 that will ensure that the magnetization of the reference layer has a predetermined direction and the layer can therefore function as a reference layer. The control current is selected so that the magnetization of the data layer, having a higher coercivity, is not affected.

The thin dielectric layer 210 is thin enough so that a tunneling current will flow through the dielectric layer when a suitable electrical potential is applied. The tunneling probability, and therefore the impedance of the memory cell, depends on the direction of the magnetization in the data layer 208 relative to that of the reference layer 212. Therefore, it is possible to determine the orientation of the magnetization in the data layer from the tunneling current which is dependent on the resistance of the memory cell 102.

In this embodiment a further layer 214 is positioned between the data-layer 208 and the bit line 216. Layer 214 may be a dielectric layer so that, when a potential is applied between the word line 204 and the bit line 216 a tunneling current will flow through the dielectric layer 214 which will result in the generation of heat. Alternatively, layer 214 may be a resistive layer composed of a material that has a relatively low electrical conductivity and heat may be generated resistively without a tunneling current. In any case, the generated heat diffuses at least in part into the data layer 208. Owing to the heat the magnetic field strength required to switch the magnetization of the data layer 208 is lower and thus heating of the data layer 208 facilitates switching of the magnetization.

Typically further layers are positioned between the data layer 208 and the bit line 216 which are not shown in order to improve clarity. For example, the layer 214 may be separated by one or more of these layer from the data layer 208 and/or the bit line 216.

If the layer 214 is a dielectric layer through which in use a tunneling current passes, the layer 214 may have a thickness ranging from 0.5 nm to 10 nm and may be composed of any suitable dielectric material including for example aluminum oxide ($Al_2O_3$), aluminum nitride (AlN), silicon oxide ($SiO_2$), silicon nitride ($Si_3N_4$), boron nitride (BN), Magnesium oxide (MgO), tantalum oxide ($Ta_2O_5$, or in general $TaO_x$) and many others. In this example the layer has a thickness of 2 nm and a planar area of 130×260 nm.

If the layer 214 is a resistive layer it may be composed of any suitable resistive material including semiconductors (e.g., Si, Ge, Se, graphite (Carbon), SiC), some conductive oxides (e.g. $TaO_2$), silicides (e.g., WSi, CoSi, FeSi, PtSi), nitrides (e.g., TaN, FeAlN, SiN). In the case of this variation of the embodiment, the layer 214 is composed of SiC. In this example the layer 214 has an area of approximately 130×260 nm and a thickness of about 5 nm.

In this particular example the data layer 208 is composed of nickel iron (NiFe), the reference layer 212 is in this example a thin ferro-magnetic layer and composed of NiFe. The dielectric layer 210 is composed of $Al_2O_3$. All layers have the same planar area of approximately 130 nm×260 nm, and the reference layer 212, the data layer 208 and the dielectric layer 210 have a thickness of approximately 2 nm, 4 nm, and 2 nm, respectively. The resistance of the layers 210 and 214 are approximately the same. Therefore, the device comprises two heat sources that develop approximately the same amount of heat. The word and bit lines are composed of copper.

Figure 3:
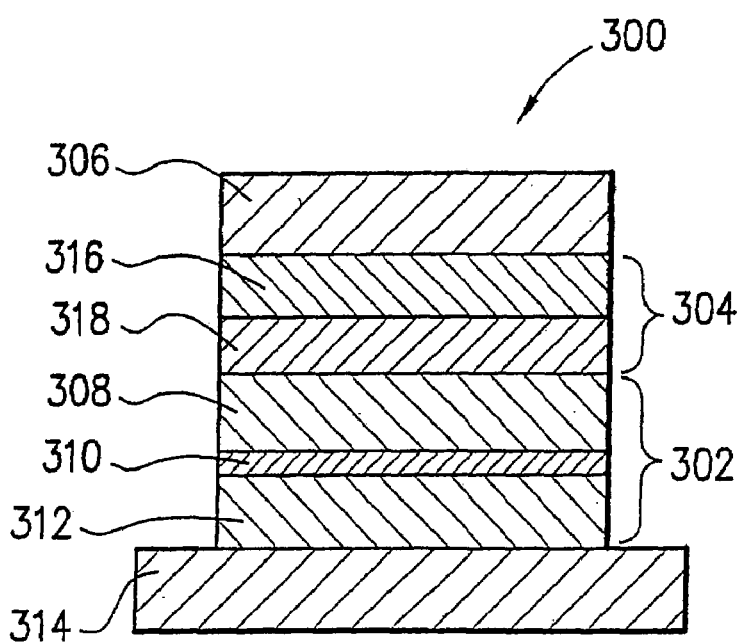
FIG. 3 is a schematic cross-sectional diagram of a magnetic memory device according to a further specific embodiment and FIG. 4 is a schematic diagram of a computer system embodying the device shown in FIG. 1.

FIG. 3 shows a cross-sectional representation of a portion of device 300. An electrical heater is positioned in the proximity of the magnetic memory cell 302 and in this embodiment the electrical heater is a thin film diode 304. Diode 304 is sandwiched between bit line 306 and memory cell 302. The memory cell 302 comprises data layer 308, dielectric layer 310 and reference layer 312. As for MRAM 200 shown in FIG. 2 and discussed above, the reference layer 312 is a soft magnetic layer and has a coercivity that is lower than that of the data layer 308.

Typically further layers are positioned between the data layer 308 and the bit line 306 which are not shown in order to improve clarity. For example, the diode 304 may be separated by one or more of these layer from the data layer 308 and/or the bit line 306.

The magnetic memory cell 302 is contacted by word line 314. When a potential is applied between the word line 314 and the bit line 306 a current will flow through the diode 304 which will result in the generation of resistive heat. The resistance of the diode 304 and therefore the heat that is generated depends on the operating conditions. For example, when the diode is reverse biased, the resistance will be relatively high whereas the resistance is lower when the diode is forward biased.

The device 300 is similar to the device 200 shown in FIG. 2. The data layer 308 is composed of nickel iron (NiFe), the reference layer 312 is a soft magnetic reference layer and is composed of NiFe and the dielectric layers 310 is composed of $Al_2O_3$. All layers have the same planar area of approximately 130 nm×260 nm, and the reference layer 312, the data layer 308 and the dielectric layer 310 have a thickness of approximately 2 nm, 4 nm, and 2 nm, respectively.

The diode 304 diode may be a conventional p-n junction and may also be a metal-semiconductor (Schottky diode) such as Pt—Si diode. The diode 304 may be incorporated into the substrate (ie into a silicon substrate). In this embodiment, the diode 304 is made with single-crystal silicon and is fabricated in the substrate level. An alternative fabrication procedure involves making an amorphous-silicon based diode. In this case the silicon can be deposited by using PECVD, CVD techniques as a thin layer within the multiple metal layers of the MRAM cell. This is particularly advantageous as then the MRAM cell can be integrated at the upper levels of the interconnects (Copper levels) in a CMOS process.

As device 100 shown in FIG. 1, devices 200 and 300 typically include read circuits for sensing the resistance of selected memory cells. During read operation, a constant voltage is applied to the bit lines and sensed by the read circuit. An external circuit may provide the constant supply voltage.

MRAMs 200 and 300 may comprise an array having any number of memory cells arranged in any number of rows and columns. They can also use alternative technologies such as colossal magneto-resistance memory cells (CMR), and giant magneto-resistance memory (GMR) cells.

Figure 4:
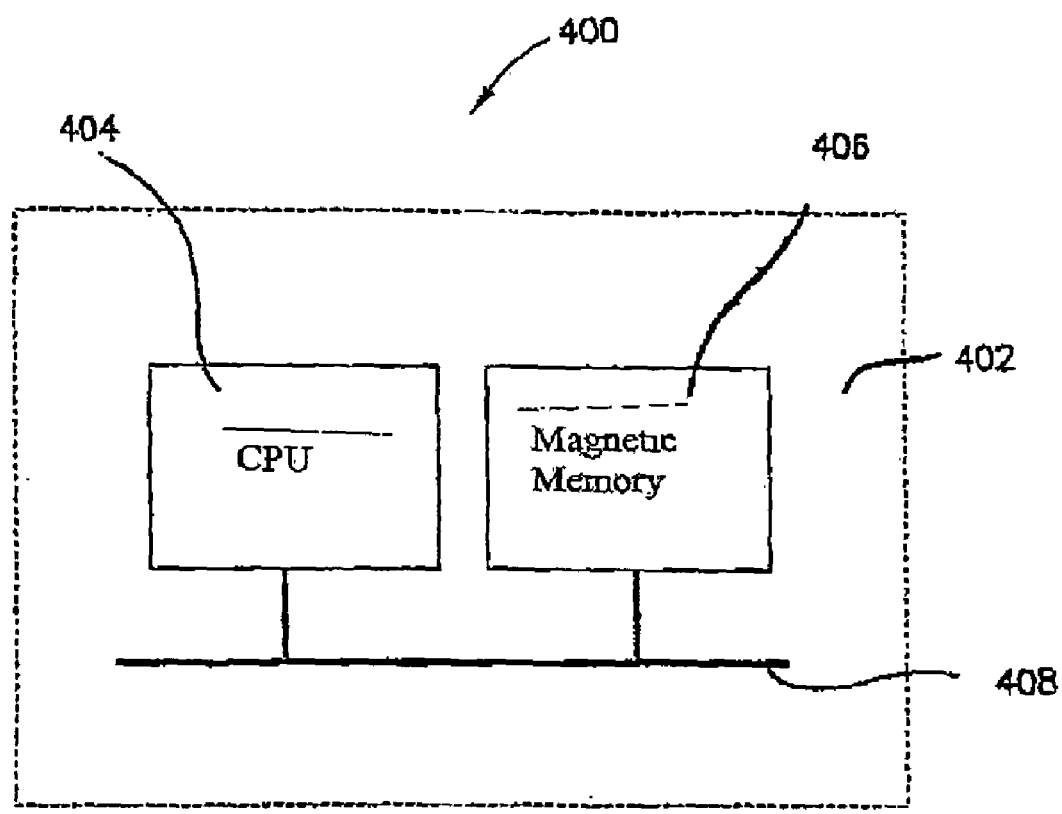

FIG. 4 shows a computer system 400 which embodies the memory device shown in FIG. 1. The computer system 400 has a main board 402 which is connected to a central processing unit 404 and magnetic memory device 406. The magnetic memory device arrays 406 includes the device shown in FIG. 1. The magnetic memory device array 406 and the central processing unit 404 are connected to a common bus 408. The computer system 404 has a range of further components which are for clarity not shown.

Figure 5:
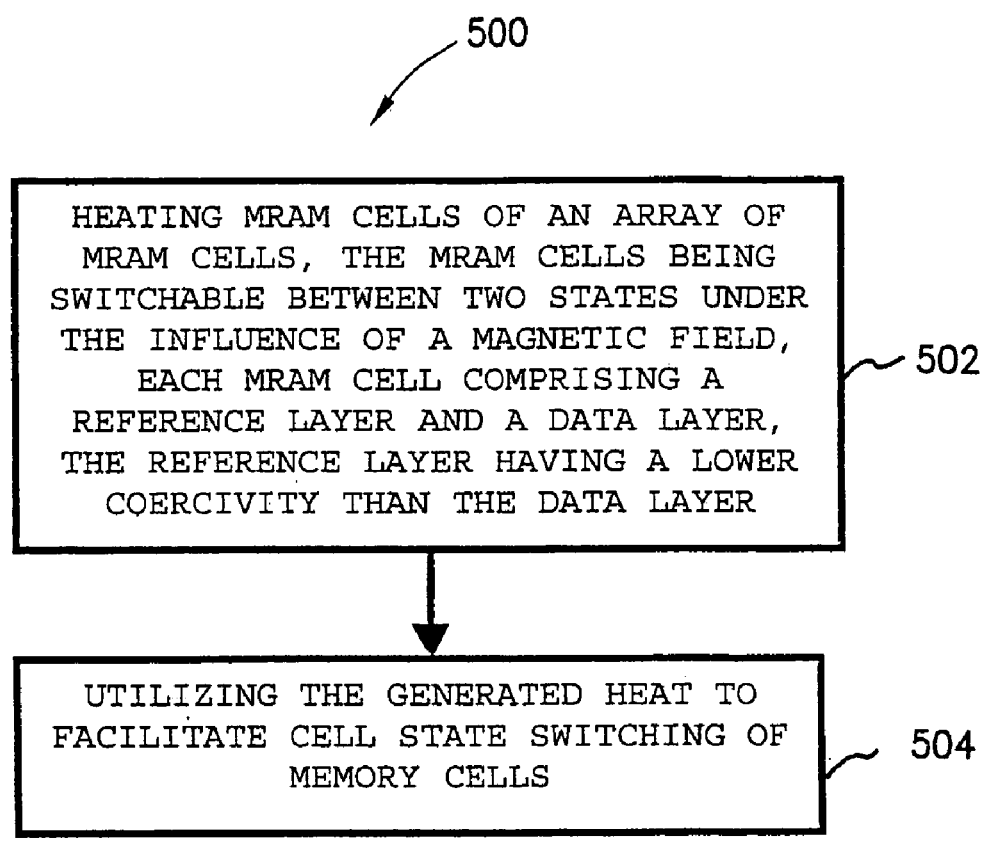
FIG. 5 is a flow-chart for a method embodiment.

FIG. 5 illustrates a method embodiment for operating an MRAM device. The method 500 comprises step 502 of heating MRM cells, such as those shown in FIG. 1. The method 500 includes step 504 of utilizing the generated heat to facilitate cell state switching.

Although the invention has been described with reference to particular examples, it will be appreciated by those skilled in the art that the invention may be embodied in many other forms. For example, the MRAM device may comprise more than one electrical heater for each MRAM cell. In addition, further layers may be disposed between the memory cell and the at least one electrical heater or between the at least one electrical heater and the bit line. In this case the magnetic memory cell may be electrically isolated form the bit and/or word lines. For example, a sense conductor may be in electrical contact with the memory cell (ie with the data layer) and an electrically insulating layer may be disposed between the bit line and the sense layer. Further, it will be appreciated that each magnetic memory cell may comprise a number of additional layers such as capping, AF and seed layers.

In addition the soft reference layer of each memory cell may include a respective word line. For example, a conductive core may carry the read and control currents. The core may be cladded with a ferromagnetic material that has a low coercivity. If the MRAM device comprises TMR cells, the cladded core may be positioned adjacent the dielectric layer of a respective TMR cell so that a current may tunnel between the cladding and the data layer through the dielectric layer.

What is claimed is:

1. A magnetic random access memory (MRAM) device comprising:
   an array of magnetic memory cells;
   a plurality of word and bit lines connecting columns and rows of the memory cells so that the memory cells are positioned at cross-points of the word and bit lines, each memory cell having a magnetic reference layer and a magnetic data layer, each magnetic reference layer and each magnetic data layer having a magnetization that is switchable between two states under the influence of a magnetic field, each reference layer having at a first temperature a coercivity that is lower than that of each data layer at the first temperature, and
   a plurality of heating elements each proximate to a respective data layer, each heating element in use providing for localized heating of the respective data layer to reduce the coercivity of the data layer so as to facilitate switching of the data layer.

2. The MRAM of claim 1, wherein:
   in use the coercivity of each heated data layer is higher than that of each reference layer.

3. The MRAM of claim 1, wherein:
   in use the coercivity of each heated data layer is lower than tat of each reference layer.

4. The MRAM of claim 1, wherein:
   each heating element is a heat-inducing layer.

5. The MRAM of claim 4, wherein:
   each beat-inducing layer is a resistive layer.

6. The MRAM of claim 5 wherein:
   the resistive layer comprises at least one of the materials Si, Ge, Se, C, SiC, $TaO_2$, WSi, CoSi, FeSi, PtSi, TaN, FeAlN and SiN.

7. The MRAM of claim 4, wherein:
   each heat-inducing layer is a dielectric layer through which in use a tunneling current is directed.

8. The MRAM of claim 7 wherein:
   the dielectric layer comprises at least one of the materials $Al_2O_3$, AlN, $SiO_2$, $Si_3N_4$, BN, MgO and $Ta_2O_5$.

9. The MRAM of claim 1, wherein:
   each heating element is a diode.

10. The MRAM of claim 9, wherein:
    the diode comprises at least one of amorphous silicon and single crystalline silicon.

11. The MRAM of claim 1, wherein:
    each memory device is a tunneling magneto-resistance (TMR) memory device.

12. A computer system comprising:
    a central processing unit,
    a main board coupled to the central processing unit and magnetic memory devices coupled to the main board, each magnetic memory device comprising:
    an array of magnetic memory cells;
    a plurality of word and bit lines connecting columns and rows of the memory cells so that the memory cells are positioned at cross-points of the word and bit lines, each memory cell having a magnetic reference layer and a magnetic data layer, each magnetic reference layer and each magnetic data layer having a magnetization that is switchable between two states under the influence of a magnetic field, each reference layer having at a first temperature a coercivity that is lower than that of each data layer at the first temperature, and
    a plurality of heating elements each proximate to a respective data layer, each heating element in use providing for localized heating of the respective data layer to reduce the coercivity of the data layer so as to facilitate switching of the data layer.

* * * * *

UNITED STATES PATENT AND TRADEMARK OFFICE
CERTIFICATE OF CORRECTION

PATENT NO. : 7,193,889 B2  Page 1 of 1
APPLICATION NO. : 10/776061
DATED : March 20, 2007
INVENTOR(S) : Manish Sharma It is certified that error appears in the above-identified patent and that said Letters Patent is hereby corrected as shown below:

On the Title page, in Item (73), in "Assignee", in column 1, line 2, delete "LP.," and insert -- L.P., --, therefor.

In column 6, line 17, in Claim 3, delete "tat" and insert -- that --, therefor.

In column 6, line 21, in Claim 5, delete "beat-inducing" and insert -- heat-inducing --, therefor.

Signed and Sealed this

Tenth Day of March, 2009

JOHN DOLL
*Acting Director of the United States Patent and Trademark Office*